United States Patent [19]

Dustmann et al.

[11] Patent Number: 4,699,800
[45] Date of Patent: Oct. 13, 1987

[54] PROCESS FOR THE PRODUCTION OF SUPERCONDUCTING FIBER BUNDLES

[75] Inventors: Cord-Henrich Dustmann, Weinheim; Georg Wahl, Eppelheim; Franz Schmaderer, Heidelberg, all of Fed. Rep. of Germany

[73] Assignee: Brown, Boveri & Cie AG, Mannheim, Fed. Rep. of Germany

[21] Appl. No.: 795,419

[22] Filed: Nov. 6, 1985

[30] Foreign Application Priority Data

Nov. 7, 1984 [DE] Fed. Rep. of Germany ....... 3440590

[51] Int. Cl.$^4$ ............................................. C23C 16/36
[52] U.S. Cl. .................................. 427/62; 427/255.2; 427/255.3
[58] Field of Search ...................... 427/62, 255.2, 255.3

[56] References Cited

U.S. PATENT DOCUMENTS 3,630,769 12/1971 Hart ........................................ 427/62
4,005,990 11/1980 Newkirk et al. ....................... 427/62
4,299,861 11/1981 Dietrich ................................ 427/62
4,336,280 6/1982 Muller ................................... 427/62

FOREIGN PATENT DOCUMENTS 3228729 2/1984 Fed. Rep. of Germany .

OTHER PUBLICATIONS

Pike, Applied Polymer Symposium, No. 29, 71–81, (1976), John Wiley and Sons, New York.
Smith, Applied Polymer Symposium, No. 29, 83–92, (1976), John Wiley and Sons, New York.
"IEEE Transactions on Magnetics", vol. MAG-11, No. 2, Mar. 1975, pp. 185–188.

Primary Examiner—Richard Bueker
Attorney, Agent, or Firm—Herbert L. Lerner; Laurence A. Greenberg

[57] ABSTRACT

Production of superconducting fiber bundles where in a CVD reactor niobium carbonitride of the general formula $NbC_xN_y$ is deposited on support fibers by means of chemical deposition from the vapor phase by reaction of niobium chloride, carbon and nitrogen compounds, and in addition to the mentioned reaction gases at least one oxygen-containing gas is introduced into the CVD reactor in a controlled manner.

22 Claims, 5 Drawing Figures

PROCESS FOR THE PRODUCTION OF SUPERCONDUCTING FIBER BUNDLES

BACKGROUND OF THE INVENTION

1. Field of the Invention

The invention relates to a process for the production of superconducting fiber bundles where in a CVD (chemical vapor deposition) reactor niobium oxycarbonitride of the general formula $NbC_xN_yO_z$ ($x, y, x, \geq 0$ and $x+y+z \leq 1$) is deposited on the support fiber by means of chemical deposition from the gaseous phase by reaction of niobium chloride and carbon and nitrogen compounds.

2. Description of the Prior Art

In the continued development of energy technology with respect to nuclear fusion and superconducting generators, of traffic technology (e.g. magnetic suspension train), of environment technology (e.g. desulfurization of coal) and of high-energy physics, strong-field magnets are needed, which can be produced only on the basis of superconductors.

A new promising superconduction material is $NbC_xN_yO_z$ ($x,y,z \geq 0$ and $x+y+z+ \leq 1$) which, applied on support fibers of a fiber bundle (consisting for example of several thousand fibers of a diameter of about 5 to 7 $\mu$m), can be used as fiber conductor. Niobium oxycarbonitride, and in particular niobium carbonitride, in which z equals zero, is outstanding for its high critical temperatures, high critical magnetic fields and high critical current densities. Any suitable material (e.g. C, SiC, B, steel) that has the necessary mechanical strength may be used as support fiber material. It serves as high tensile strength matrix and as substrate for a chemical vapor deposition method (CVD=chemical vapor deposition) in which the niobium is deposited as a thin film by reaction of $NbCl_5$ with $H_2$ in the presence of the carbon and nitrogen-containing gases. The CVD process is carried out either in a single stage (simultaneous Nb deposition and carbonitration) or in two stages (Nb deposition and carbonitration successively).

Various methods for the deposition of niobium carbonitride or niobium oxycarbonitride are known from German DE-AS No. 28 56 885 and German DE-OS No. 32 28 729. While the method described in DE-AS No. 28 56 885 furnishes in principle superconducting layers which are still too coarse-grained for optimum superconductor properties to be obtained, the necessary fine grain of the superconducting crystals can be obtained by methods according to DE-OS No. 32 28 729. The mean grain size of the B1-structure niobium oxycarbonitride is adjustable between 3 and 50 nm. It has been found, however, that the required and theoretically possible superconduction properties (with regard to current carrying capacity and critical magnetic field) are not yet attainable by the production of superconducting layers using the method according to DE-OS No. 32 28 729.

SUMMARY OF THE INVENTION

It is, therefore, an object of the invention to provide a process for the production of superconducting fiber bundles of the initially mentioned kind by which the superconductor properties of niobium oxycarbonitride, in particular of niobium carbonitride, can be improved, that is, by which the critical current density $I_C$ and the critical magnetic field intensity $H_{C2}$ can be raised substantially as compared with the values attainable with the use of the known methods. In particular, a sufficiently fine grain of the superconducting layer is to be obtainable.

With the foregoing and other objects in view, there is provided in accordance with the invention a process for the production of superconducting fiber bundles which comprises, depositing niobium carbonitride oxycarbonitride of the general formula $NbC_xN_yO_z$ wherein x, y, z, $\geq 0$ and $x+y+z \leq 1$, on support fibers in a CVD reactor by means of chemical deposition from the vapor phase by reaction of niobium chloride, carbon and nitrogen compounds and in addition to the mentioned reactants introducing at least one oxygen-containing gas into the CVD reactor and regulating the amount of oxygen-containing gas introduced into the CVD reactor to effect improvement of the superconduction properties of current carrying capacity and critical magnetic field strength of the niobium oxycarbonitride deposited on the support fibers.

Other features which are considered as characteristic for the invention are set forth in the appended claims.

Although the invention is illustrated and described herein as embodied in a process for the production of superconducting fiber bundles, it is nevertheless not intended to be limited to the details shown, since various modifications may be made therein without departing from the spirit of the invention and within the scope and range of equivalents of the claims.

BRIEF DESCRIPTION OF THE DRAWINGS

The invention, however, together with additional objects and advantages thereof will be best understood from the following description when read in connection with the accompanying drawings, in which.

DESCRIPTION OF THE PREFERRED EMBODIMENTS

Figure 1:
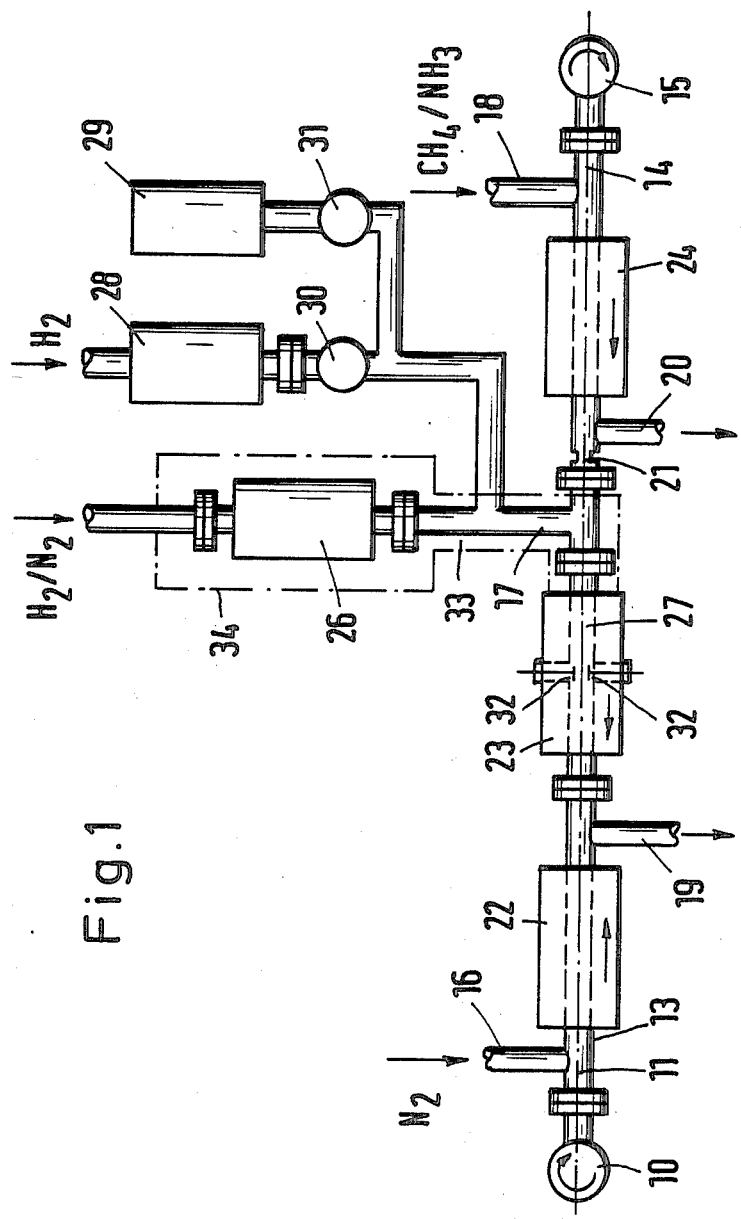
FIG. 1 shows schematically a CVD apparatus for the NbCN coating of C fibers.

According to the invention, the problem of improving the superconductor properties of niobium oxycarbonitride, in particular the critical current density and the critical magnetic field intensity is solved in that, in addition to the mentioned reaction gases, at least one oxygen-containing gas is introduced into the CVD reactor in a controlled manner.

According to the known processes (DE-AS No. 28 56 885 and DE-OS No. 32 28 729), the CVD apparatus is operated at atmospheric pressure or at reduced pressure, with the result that an uncontrolled degree of oxygen contamination, e.g. through leaks in the apparatus or through contaminated fiber material or contaminated reaction gases, occurs. Tests have shown that the oxygen component in the superconducting layer was at or below the threshold of what is measurable. It had not been observed until now that the layer formation is influenced by oxygen or oxygen-containing compounds in fiber material coated with niobium oxycarbonitride.

Through the use of the process according to the invention a surprisingly strong dependence of the superconducting properties on the concentration of an oxygen-containing gas added to the CVD process was noted. The addition of water vapor as the oxygen-containing gas has proved especially successful. The added quantity of water vapor can be adjusted precisely by a thermostat-controlled vaporizer with a connected heat exchanger and throttle valve.

It has been found by using the process of the invention that in particular the critical current density $I_C$ can be increased in the high-field range (e.g. at 13 tesla) by a factor of about 20. Also, the addition of $H_2O$ leads to a reduced dependence of the critical current $I_C$ on the magnetic field, and the critical magnetic field can thereby be increased substantially ($H_{C2}$ is about 40 to 50 tesla).

The continuous addition of $H_2O$ during the niobium deposition process affects the nucleus formation in the growth process of the superconducting crystals and leads to grain refinement of the deposited layer, as has been proven by X-ray analyses. The reason for this may be that the oxygen of the $H_2O$ reduces the surface diffusion on the substrate surface and together with a high oversaturation of the reaction gas increases the nucleus formation.

The substantial improvement of the superconducting properties is observable at a $H_2O$ substance quantity content between 0.15% and 8% of the reaction gas mixture. A range between 1.2% and 2.5% is to be regarded as especially favorable. The best results have thus far been obtained at a $H_2O$ substance quantity content of about 1.7%. When using a two-stage CVD process, it is advantageous not only to add the water vapor in the region of the niobium deposition but also in the region of the second stage, in which the carbonitration takes place. The supplementary $H_2O$ addition (preferably the same quantity as in stage 1) in stage 2 prevents the partial or complete removal of the oxygen from the NbCN layer by reduction of the oxygen by the carbon and nitrogen compounds (e.g. methane or ammonia).

Another especially advantageous embodiment of the process according to the invention is admixing to the CVD reaction gas a silicon-containing, boron-containing, aluminum-containing and/or other metallic compound in the gaseous phase for the formation of niobium silicide, niobium borite, niobium aluminide or other intermetallic compounds.

So-called pinning centers are formed by this admixture, by which the critical magnetic field strength $H_{C2}$ is increased, while the magnetic field dependence of the critical current $I_C$ decreases. Pinning centers are inhomogeneities in the super-conducting material in the order of magnitude of the coherence length of about 5 nm, which differ greatly in their electrical properties from the superconducting material. In view of the distinct increase of the critical magnetic field strength $H_{C2}$, a slight decrease of the current carrying capacity (with increasing admixture component) can be accepted.

Suitable for admixture to the CVD reaction gas are for example silicon halides such as silicon chloride ($SiCl_4$), which during the CVD deposition are transformed into niobium silicide ($Nb_5Si_3$), which separates out in the superconducting material as pinning grains or pinning boundary layers.

Also suitable for admixture to the the CVD reaction gas are boron halides such as boron chloride ($BCl_3$), which change over into niobium boride ($NbB_2$).

Further gaseous metal halides, e.g. aluminum chloride ($AlCl_3$) may also be supplied to the CVD reaction gas, by which intermetallic compounds, such as niobium aluminide ($Nb_3Al$), are formed as pinning centers.

Instead of the mentioned halides, alkyls (e.g. metal alkyls such as tri-isobutyl aluminum) or acetyl acetonates of silicon, boron, aluminum or other metals may serve for admixture to the CVD reaction gas.

The percentage of such additive for admixture in the CVD reaction gas is advantageous between 0.2% and 1% of the CVD reaction gas. A favorable range of the quantity content of the additive in the admixture is between 0.45% and 0.65%. For the admixture of silicon chloride ($SiCl_4$) a content of 0.55% of the CVD reaction gas may be regarded as particularly favorable.

It is advantageous to flush the gaseous additive for admixture into the CVD reactor by addition of hydrogen gas ($H_2$) and/or nitrogen gas ($N_2$), which serve as a carrier gas.

Other advantageous developments and realizations of the invention as well as additional advantages will be explained and described more specifically with reference to an embodiment of the invention.

FIG. 1 shows a CVD apparatus by means of which niobium oxycarbonitride is deposited on carbon fibers in a two-stage process.

An unwinding chamber 10 contains a raw material spool which carries the uncoated support fibers 11 (carbon fibers). The support fibers 11 are pulled by a fiber transport means, not shown, through a quartz tube 13 in which the coating of the support fibers 11 takes place. The coated fibers 14 are reeled onto a receiving spool contained in a winding chamber 15. In the quartz tube 13 are three gas inlets 16, 17, 18, through which nitrogen $N_2$, gaseous niobium chloride $NbCl_5$ with a mixture of hydrogen and nitrogen $H_2/N_2$ as carrier gas, water vapor $H_2O$ with the carrier gas hydrogen $H_2$, gaseous silicon chloride $SiCl_4$ and a mixture of methane and ammonia $CH_4/NH_3$ can be admitted into the quartz tube 13. The gas present inside the quartz tube 13 can be pumped off via two pump connecting pipes 19 and 20, and a vacuum created in the quartz tube 13.

Pressure equalization in the quartz tube 13 is prevented by means of a throttle point 21, through which the fiber bundle can be pulled, so that inside the quartz tube 13 different pressures before and behind the throttle point 21 can adjust themselves.

During its transport from the unwinding chamber 10 to the winding chamber 15, the fiber bundle passes through three furnaces 22, 23, 24 (a possible fourth furnace in which the coated fibers can be covered with a highly conductive copper layer, see No. DE-OS 32 28 729, has not been shown here).

In the first furnace 22, the carbon fibers 11 are, if necessary, purified by being heated in a nitrogen or hydrogen atmosphere. The quantity of gas fed into the gas inlet 16 is for example between 1 and 20 liters per hour. The furnace temperature is set to 600° to 1000° C.

In the second furnace 23 (CVD reactor) the fibers 11 are coated in a $NbCl_5$-$H_2$-$N_2$ gas mixture with a Nb-containing compound. The required $NbCl_5$ gas is transformed from a solid in solids vaporizer 26, which may, however, be replaced by a vaporizer for transforming liquid $NbCl_5$ from the liquid phase, into the gaseous phase and is conducted with a hydrogen-nitrogen mixture serving as a carrier gas, via the gas inlet 17, into the CVD reactor 27. The temperature of the solids vaporizer 26 is adjusted to a value between 80° and 200° C. The inflow quantity of the $NbCl_5$-$H_2$-$N_2$ gas mixture is between 2 and 20 liters per hour. The temperature of the furnace 23 is set between 600° and 1000° C. The residual gas is pumped off via the pump connection 19.

Water vapor and gaseous silicon chloride, which get into the CVD reactor 27 via the gas inlet 17 are admixed to the gaseous niobium chloride. The water vapor is produced in a vaporizer 28, which will be explained in greater detail later with reference to FIG. 2. A vaporizer 29 is used to vaporize the silicon chloride. Vaporizer 29 consists of a glass vessel, in which the silicon chloride is heated to about 30° C. and maintained constant. At this temperature a sufficient silicon chloride vapor pressure develops. Thermal flowmeters 30, 31 are used for adjusting the required water vapor and silicon chloride quantities, which flowmeters are arranged between the respective vaporizer 28, 29 and the gas inlet 17. The quantity of flow can be both set and read on the thermal flowmeters 30, 31.

In the third furnace 24, the second stage of the CVD process for the production of the superconducting layer takes place. Through the gas inlet 18 a carbon- and nitrogen-containing gas mixture (e.g. 0 to 50 vol. % methane, 0 to 50 vol. % ammonia, balance nitrogen) is admitted to the quartz tube 13. The inflow quantity of methane and ammonia is between 2 and 15 liters per hour. The third furnace 24 is held at a temperature between 700° and 1100° C. The methane and ammonia gases will then dissociate and carbon and nitrogen penetrate into the niobium layer. The residual gas is pumped off via pipe 20.

To prevent the oxygen which in the first stage is incorporated in the NbCN layer from being reduced by the carbon and nitrogen compounds in the second stage of the CVD process and from being thus removed from the superconducting layer, it may be advantageous to also connect a $H_2O$ vaporizer at the gas inlet 18, which $H_2O$ vaporizer may be identical with the previously mentioned vaporizer 28.

In principle it is possible to operate the deposition apparatus in a single stage, that is, in furnace 23 niobium is deposited and carbonitrated in a carbon- and nitrogen-containing atmosphere simultaneously.

Through suitably applied flow resistances (throttle points 21) and suitable layout of the pumps connected to the pipes 19, 20, the quartz tube 13 (reactor) and the gas supply are designed so that the gases in the furnaces 22, 23, 24 flow in the direction of the arrows.

The niobium deposition in furnace 23 may also occur under plasma activation. The plasma activation can be excited by a gas discharge between two opposite electrode plates 32.

Appropriately, the quartz tube 33 between the solids vaporizer 26 and furnace 23 is thermostabilized to maintain the gas temperature. This measure is indicated by a dash-dot line 34 in FIG. 1.

In the following are stated some process parameters advantageous for the illustrated deposition apparatus:

| Temperatures: | |
|---|---|
| $T_{f22}$ = | 1000° C. |
| $T_{f23}$ | 960° C. |
| $T_{f24}$ | 1100° C. |
| $T_{NbCl_5(column)}$ | 113° C. |
| $T_{H_2O}$ | 15° C. |
| $T_{SiCl_4}$ | 30° C. |
| Total pressure in the CVD reactor 27: p = 0.6 kPa | |
| Gas inflow quantities: | |
| $i_{16(N_2)}$ = | 10 $lh^{-1}$ (liter hours) |
| $i_{17(N_2)}$ = | 10 $lh^{-1}$ (liter hours) |
| $i_{17(H_2)}$ = | 10 $lh^{-1}$ (liter hours) |
| $i_{18(NH_3)}$ = | 10 $lh^{-1}$ (liter hours) |
| $i_{18(CH_4)}$ = | 10 $lh^{-1}$ (liter hours) |
| Fiber velocity: $V_F$ = 6 cm $min^{-1}$. | |

Figure 2:
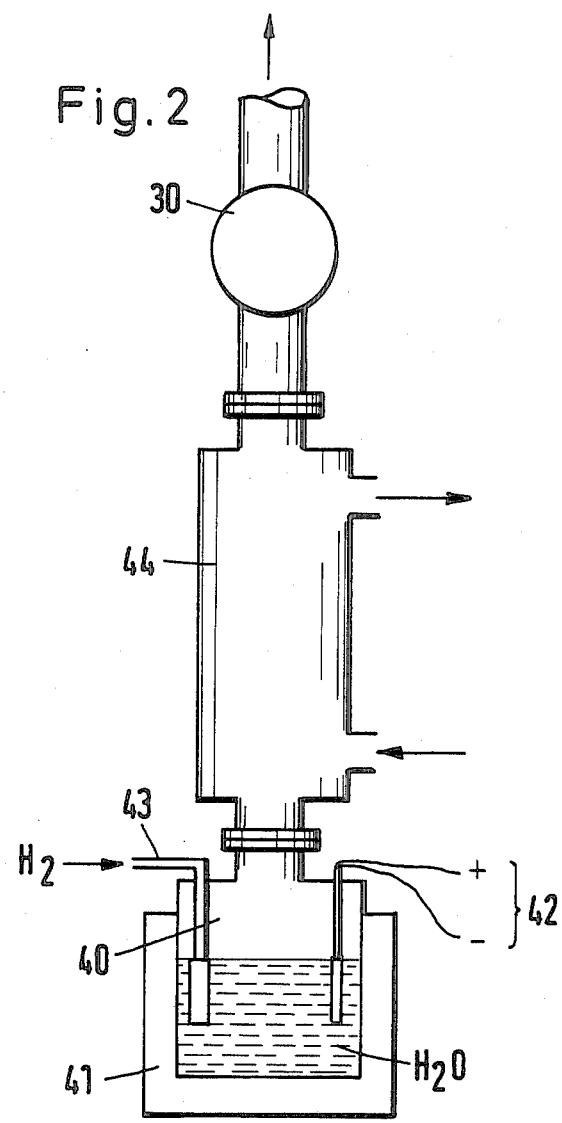
FIG. 2, schematically, an $H_2O$ vaporizer.

In FIG. 2, the vaporizer 28 of FIG. 1 is illustrated in greater detail. A vaporizer 40 contains water $H_2O$. The vaporizer 40 is surrounded by a thermostat-controlled heater 41, which adjusts to maintain a uniform water temperature of 30° C. The water temperature is measured and monitored by a thermocouple 42. Hydrogen gas $H_2$ is introduced into the water through an inflow line 43. Above the water surface a total pressure of 100 kPa prevails, composed of the partial pressures of the water and the hydrogen.

The gas mixture of water and hydrogen leaves the vaporizer 40 and flows through a heat exchanger 44, which is followed by an adjustable thermal flowmeter 30, shown also in FIG. 1.

In the heat exchanger (column) 44 the water/hydrogen mixture is temperature controlled. Here a water partial pressure adjusts itself which follows the vapor pressure curve of the water. For example, at a gas temperature of about −16° C. the water partial pressure is 0.15 kPa, corresponding to an additive quantity content $x_{H_2O}$ of 0.15%. At a gas temperature of about 40° C. the additive quantity content $x_{H_2O}$ is 8% (on the assumption that the total pressure is 100 kPa). It is thus possible to adjust the additive quantity content $x_{H_2O}$ with reference to the exchanger temperature. A temperature range of the gas in the heat exchanger 44 especially favorable for the CVD process is between 10° C. and 20° C., which according to the vapor pressure curve corresponds to an additive quantity content x between 1.2% and 2.5%. A preferred adjustment is at 15° C., i.e. quantity content x of 1.7%

In the flowmeter 30, the water/hydrogen total pressure is lowered from 100 kPa to 0.6 kPa, the total pressure p in the CVD reactor. The ratio between the partial water vapor pressure and the total pressure, i.e. the quantity content of the water, does not change.

Figure 3:
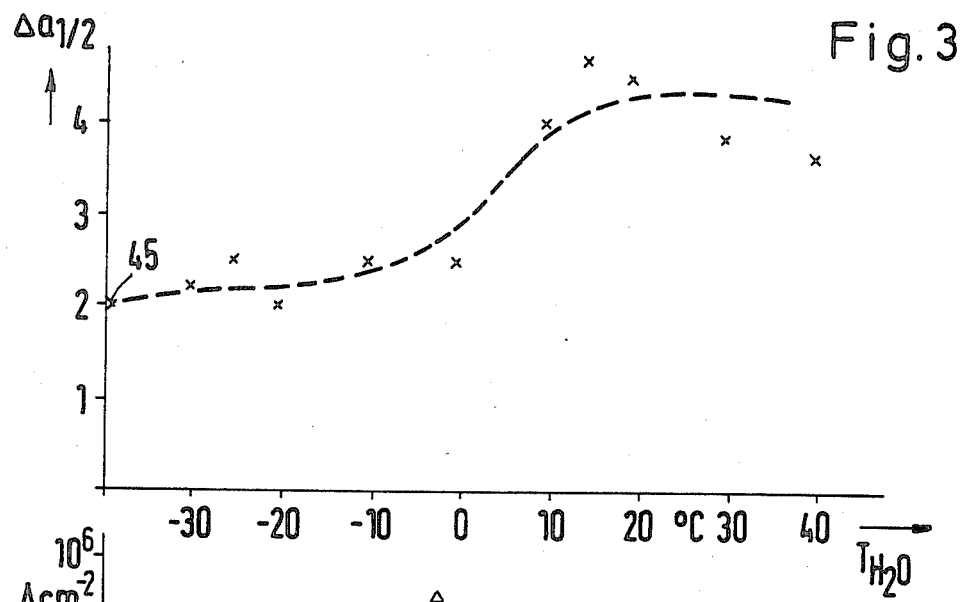
FIG. 3, a diagram which represents the half-width value of the (200) x-ray line of $NbC_xN_y$ as a function of the $H_2O$ vaporization temperature.

Despite the $H_2O$ addition to the CVD reaction gas, no appreciable oxygen content has been observable heretofore in the superconducting layer. However, with reference to the x-ray structure analysis it was possible to prove that the presence of water vapor in the reaction gas influences the growth of the niobium carbonitride crystals. The half-width value of the (200)x-ray line as a function of the $H_2O$ temperature in the heat exchanger 44 was measured. The measurement result is illustrated in FIG. 3. The half-width (delta alpha ½) of the x-ray line is shown in the ordinate in arbitrary units.

It is found that at gas temperatures in the heat exchanger between −16° C. (this corresponds to a $H_2O$ substance quantity content of 0.15%) and +40° C. ($H_2O$ substance quantity content of 8%) the x-ray line half-width approximately doubles. As an increasing x-ray line half-width points to a grain refinement of the crystal structure, a grain refinement in the superconducting layer can be proven by the measurement result. The measured point 45 located directly at the ordinate was determined on superconducting layers which had been produced without addition of water. The grain refinement was verified also by transmission electron microscopy.

Figure 4:
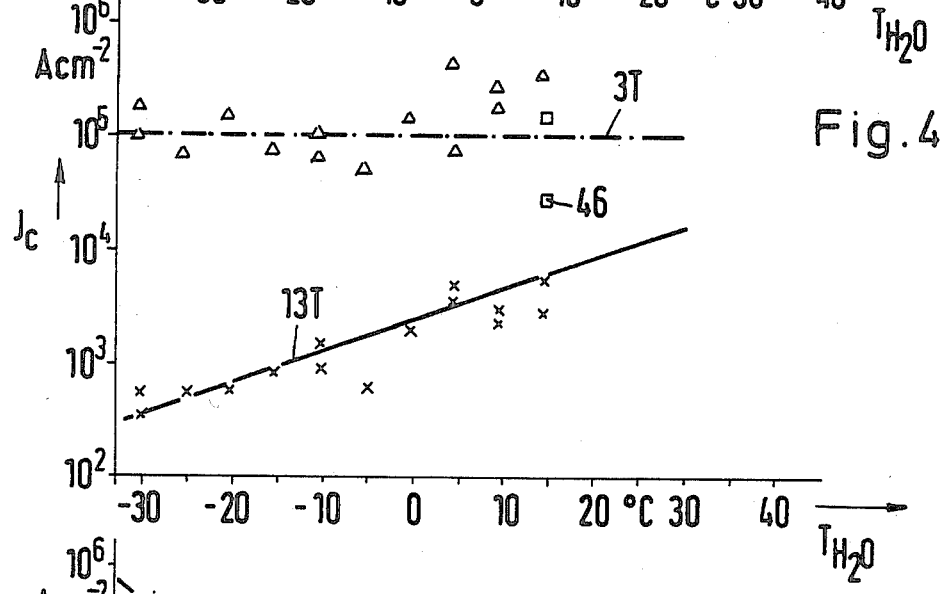
FIG. 4, a diagram which represents the critical current density $I_C$ as a function of the $H_2O$ vaporization temperature.

The addition of H₂O leads to a lesser magnetic field dependence of the critical current density $I_C$, as can be derived from FIG. 4. In FIG. 4, the critical current density $I_C$ is plotted against the heat exchanger temperature $T_{H_2O}$. One measurement was carried out at 3T, another at 13T (temperature T=4.7 K). In the low-field region (3T) the critical current density $I_C$ is almost independent of the H₂O addition. In the high-field region (13T), on the contrary, a distinct dependence of the critical current density $I_C$ on the substance quantity content of the water in the reaction gas (here expressed by the gas temperature in the heat exchanger) is demonstrable. For gas temperatures in the heat exchanger 44 of +15° C. (this corresponds to a substance quantity content of about 1.7%) the difference of the critical current density $I_C$ between low-field and high-field region is much smaller than for lower H₂O concentrations.

In FIG. 4 there has been entered a measured point 46 which was determined for a superconducting layer at 13T, in the production of which H₂O (15° C.) as well as SiCl₄ (0.25 lh⁻¹) had been added to the CVD reaction gas. The measured value makes it clear that the SiCl₄ addition leads to a further reduction of the magnetic field dependence of the critical current density $I_C$.

Figure 5:
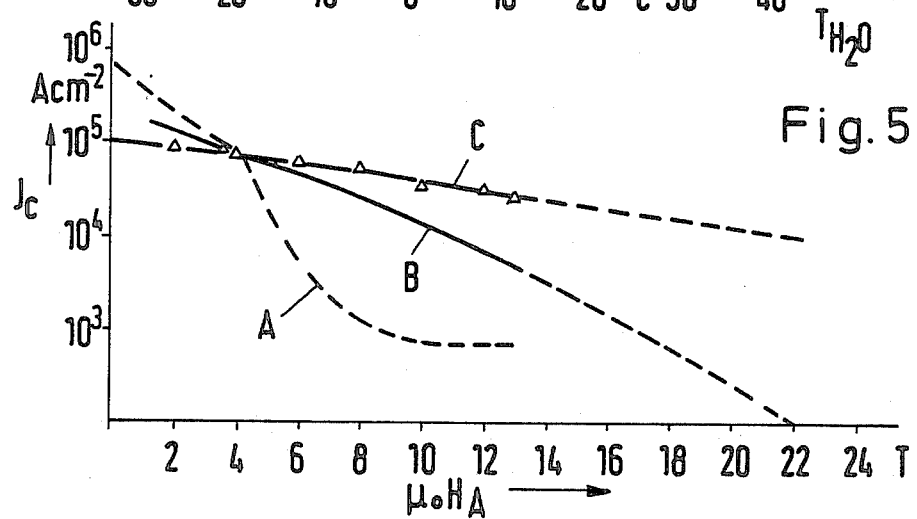
FIG. 5, a diagram which represents the critical current density $I_C$ as a function of the outer magnetic field strength $H_A$.

By the addition of water and silicon chloride to the reaction mixture the critical magnetic field can be substantially increased, as can be seen from FIG. 5. There the critical current density $I_C$ is plotted against the induction of the outer magnetic field $H_A$. Curve A was recorded with superconductors which had been produced without addition of water or silicon chloride. Curve B corresponds to an addition of water at $T_{H_2O}$= +15° C. (substance quantity content of 1.7%). Curve C was measured on superconductors which had been produced by a CVD process in which both water ($T_{H_2O}$=15° C.) and silicon chloride (0.25 lh⁻¹) had been added to the reaction mixture.

It can be seen from the curves in FIG. 5 that above an induction of about 4T curves B and C lie clearly above curve A (without addition of water or silicon chloride). For curve B a critical magnetic field of about 22T, and for curve C, a critical magnetic field of 40 to 50T can be extrapolated.

The foregoing is a description corresponding, in substance, to German application No. P 34 40 590.9, dated Nov. 7, 1984, international priority of which is being claimed for the instant application and which is hereby made part of this application. Any material discrepancies between the foregoing specification and the specification of the aforementioned corresponding German application are to be resolved in favor of the latter.

There is claimed:

1. Process for the production of superconducting fiber bundles which comprises, depositing niobium carbonitride of the general formula $NbC_xN_y$ wherein $x+y \leq 1$, on support fibers in a CVD reactor by means of chemical deposition from the vapor phase by reaction of niobium chloride, carbon and nitrogen compounds and in addition to the mentioned reactants introducing water vapor into the CVD reactor and regulating the amount of water vapor introduced into the CVD reactor to adjust the composition of the reaction gases such that said water vapor is between 0.15% and 8% by volume of the reaction gases to effect improvement of the superconduction properties of current carrying capacity and critical magnetic field strength of the niobium carbonitride deposited on the support fibers.

2. Process according to claim 1, wherein the composition of the reaction gases is adjusted such that said water vapor content is between 1.2% and 2.5% by volume of the reaction gases.

3. Process according to claim 1, wherein the composition of the reaction gases is adjusted such that said water vapor content is approximately 1.7% by volume of the reaction gases.

4. Process according to claim 1, wherein the CVD process is carried out in two stages, the niobium being deposited on the support fibers in a first process step and carbon- and nitrogen-containing compounds being added in a second process step for carbonitration of the Nb layer, and wherein the addition of the water vapor occurs in both process steps.

5. Process according to claim 4, wherein the water vapor is added in the same quantity in both process steps.

6. Process according to claim 1, wherein a gaseous silicon-containing compound is admixed to the reaction gas for the formation of niobium silicide ($Nb_5Si_3$).

7. Process according to claim 1, wherein a gaseous boron-containing compound is admixed to the reaction gas for the formation of niobium boride ($NbB_2$).

8. Process according to claim 1, wherein a metal-containing compound is admixed to the reaction gas for the formation of an intermetallic compound.

9. Process according to claim 1, wherein an aluminum-containing compound is admixed to the reaction gas for the formation of niobium aluminide ($Nb_3Al$).

10. Process according to claim 6, wherein the composition of the reaction gas is adjusted such that the content of the silicon-containing compound is between 0.2% and 1% by volume of the reaction gas.

11. Process according to claim 10, wherein the content is between 0.45% and 0.65% by volume.

12. Process according to claim 10, wherein the content is approximately 0.55% by volume.

13. Process according to claim 7, wherein the composition of the reaction gas is adjusted such that the content of the boron-containing compound is between 0.2% and 1% by volume of the reaction gas.

14. Process according to claim 13, wherein the content is between 0.45% and 0.65% by volume.

15. Process according to claim 13, wherein the content is approximately 0.55% by volume.

16. Process according to claim 8, wherein the composition of the reaction gas is adjusted such that the content of the intermetallic compound is between 0.2% and 1% by volume of the reaction gas.

17. Process according to claim 16, wherein the content is between 0.45% and 0.65% by volume.

18. Process according to claim 16, wherein the content is approximately 0.55% by volume.

19. Process according to claim 9, wherein the composition of the reaction gas is adjusted such that the content of the aluminum-containing compound is between 0.2% and 1% by volume of the reaction gas.

20. Process according to claim 19, wherein the content is between 0.45% and 0.65% by volume.

21. Process according to claim 19, wherein the content is approximately 0.55% by volume.

22. Process according to claim 1, wherein an additive selected from the group consisting of a gaseous silicon-containing compound, a gaseous boron-containing compound and a metal-containing compound are flushed into the CVD reactor by a carrier gas selected from the group consisting of hydrogen gas and nitrogen gas.

* * * * *